US012563740B2

(12) United States Patent
Mendonsa et al.

(10) Patent No.: US 12,563,740 B2
(45) Date of Patent: Feb. 24, 2026

(54) MECHANICAL MAGNETORESISTANCE DEVICE

(71) Applicant: Seagate Technology LLC, Fremont, CA (US)

(72) Inventors: Riyan Alex Mendonsa, Minneapolis, MN (US); Brett R. Herdendorf, Mound, MN (US); Krishnan Subramanian, Shakopee, MN (US); Mark T. Kief, Lakeville, MN (US); Jon D. Trantham, Chanhassen, MN (US)

(73) Assignee: SEAGATE TECHNOLOGY LLC, Fremont, CA (US)

( * ) Notice: Subject to any disclaimer, the term of this patent is extended or adjusted under 35 U.S.C. 154(b) by 412 days.

(21) Appl. No.: 18/183,880

(22) Filed: Mar. 14, 2023

(65) Prior Publication Data

US 2023/0301115 A1      Sep. 21, 2023

Related U.S. Application Data

(60) Provisional application No. 63/322,115, filed on Mar. 21, 2022.

(51) Int. Cl.
| | |
|---|---|
| *H10B 61/00* | (2023.01) |
| *H10N 50/01* | (2023.01) |
| *H10N 50/10* | (2023.01) |

(52) U.S. Cl.
CPC ............. *H10B 61/00* (2023.02); *H10N 50/01* (2023.02); *H10N 50/10* (2023.02)

(58) Field of Classification Search
None
See application file for complete search history.

(56) References Cited

U.S. PATENT DOCUMENTS

| | | | |
|---|---|---|---|
| 5,587,943 | A | 12/1996 | Torok et al. |
| 7,286,429 | B1 | 10/2007 | Liaw et al. |
| 2009/0262570 | A1* | 10/2009 | Potok .................. G11C 11/5607 |
| | | | 365/158 |
| 2019/0096535 | A1* | 3/2019 | Olshansky ............... G21B 3/00 |

OTHER PUBLICATIONS

Meyer, Judith , et al., "Giant magnetoresistance effects in gel-like matrices", Smart Materials and Structures, vol. 22, No. 2, Jan. 28, 2013.

* cited by examiner

*Primary Examiner* — Farhana A Hoque
(74) *Attorney, Agent, or Firm* — HOLZER PATEL DRENNAN

(57) ABSTRACT

The described technology provides implementations of a mechanical magnetoresistance device. The mechanical magnetoresistance device includes a first magnetoresistive well, the magnetoresistive well including at least one magnetic element and a suspension substrate, wherein the at least one magnetic element is suspended in the suspension substrate. The mechanical magnetoresistance device further includes a first conductive element in electronic communication with a first portion of the first magnetoresistive well, a second conductive element in electronic communication with a different second portion of the first magnetoresistive well, wherein the first conductive element is in electronic communication with the second conductive element via the first magnetoresistive well.

19 Claims, 10 Drawing Sheets

500

518F

518E

518D

518C

518B

518A

600

602 — Sense Resistance Across Magnetoresistive Well

604 — Apply Magnetic Field To The Magnetoresistive Well To Reset

606 — Apply Magnetic Field To Magnetoresistive Well To Write Data

608 — Sense Resistance Across Magnetoresistive Well To Check Written Data

700

702 — Sense A Resistance State Across The Magnetoresistive Well

704 — Determine A Written Data State Based On The Sensed Resistance

800

802 — Apply Magnetic Field To Magnetoresistive Well To Reset

804 — Sense Resistance Across Magnetoresistive Well

806 — Determine Sensed Magnetic Property Based On Sensed Resistance

900

902 — Form MMR Device Components

904 — Introduce The Suspension Substrate To The Magnetoresistive Well

906 — Suspend Magnetic Elements In The Suspension Substrate

908 — Couple The First And Second Conductive Elements To Sides Of Magnetoresistive Well 910 — Calibrate The MMR Device.

MECHANICAL MAGNETORESISTANCE DEVICE

CROSS-REFERENCE TO RELATED APPLICATIONS

This application claims a benefit of priority to U.S. Provisional Application No. 63/322,115, entitled "Mechanical Magnetoresistance Device," and filed on Mar. 21, 2022, which is specifically incorporated by reference for all that it discloses and teaches.

BACKGROUND

Giant magnetoresistance (GMR) is a quantum mechanical magnetoresistance effect. The effect causes a significant and detectable change in electrical resistance resulting from the configuration of magnetization of adjacent ferromagnetic layers. When arranged in parallel, the resistance is low, and when arranged in antiparallel, the resistance is high. Applying an electromagnetic field to a GMR element causes changes to the electrical resistance that can be measured and potentially interpreted. GMR devices are cumbersome to use. Other magnetoresistance devices may provide better solutions in practice than GMR devices.

SUMMARY

The described technology provides implementations of a mechanical magnetoresistance device. The mechanical magnetoresistance device includes a first magnetoresistive well, the magnetoresistive well including at least one magnetic element and a suspension substrate, wherein the at least one magnetic element is suspended in the suspension substrate. The mechanical magnetoresistance device further includes a first conductive element in electronic communication with a first portion of the first magnetoresistive well, a second conductive element in electronic communication with a different second portion of the first magnetoresistive well, wherein the first conductive element is in electronic communication with the second conductive element via the first magnetoresistive well.

This summary is provided to introduce a selection of concepts in a simplified form that is further described below in the Detailed Description. This summary is not intended to identify key features or essential features of the claimed subject matter, nor is it intended to be used to limit the scope of the claimed subject matter.

Other implementations are also described and recited herein.

DETAILED DESCRIPTION

Figure 1:
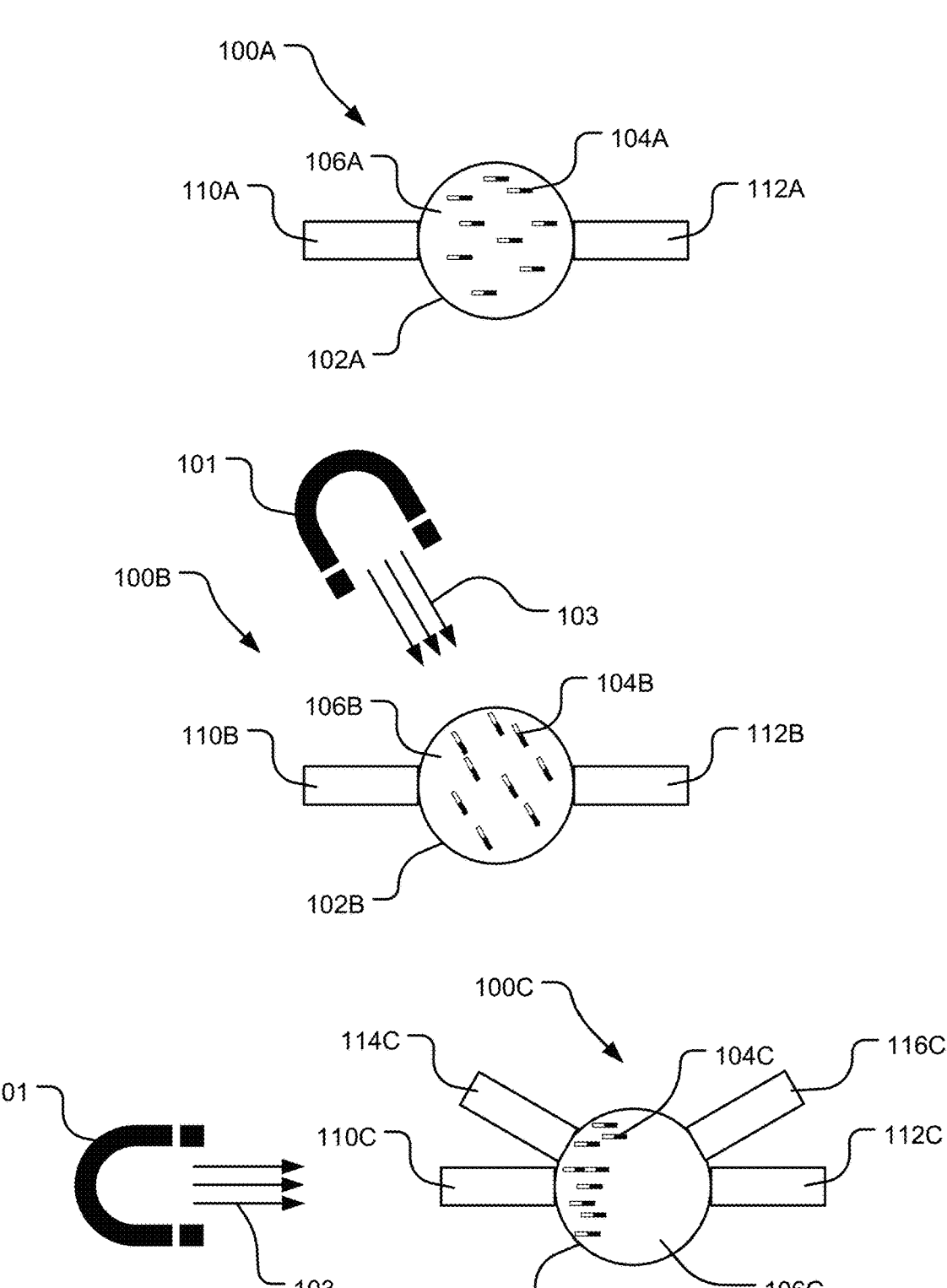
FIG. 1 illustrates example implementations of MMR devices.

Giant magnetoresistance (GMR) devices are devices that rely on the GMR effect. GMR devices can be used for a number of applications. Existing fabrication processes for GMR elements are cumbersome. Their configurations require sensitive systems with low tolerances for error and may require cleanroom environments for assembly.

The presently disclosed technology provides a mechanical magnetoresistance (MMR) device for use in commercial devices. Magnetic elements (e.g., at least one magnetic particle) can be suspended in a suspension substrate. The suspension substrate may allow rotation and/or cohesion of the suspended magnetic elements while maintaining the magnetic elements in suspension. An MMR device may include magnetoresistive wells (or cells) that each contain a suspension substrate and the magnetic elements suspended therein. Applying a magnetic field to the magnetoresistive well may change the orientation of the magnetic elements in the magnetoresistive well. When running an electrical current through (or creating an electrical potential across) the magnetoresistive well with the magnetic elements of changed orientation, the resistance measured across the well (e.g., at conductive elements electrically coupled to the magnetoresistive well) will differ from a resistance measured across the magnetoresistive well when the magnetic field is not applied.

Various types of substrates (e.g., polymeric and/or gel) can differ in properties. For example, some may be configured to possess a particular elasticity. The substrate may include one or more of a polymer, a cation, an anion, and a cross-linker. Examples of different materials that may be used for the substrates include one or more of glycerin-water mixtures, ionic liquids, molten salts (e.g., [EMIM][BF4]), electrolytic gels (e.g., a triblock co-polymer such as SOS used for example as a gel network), 1-butyl; -3-methylimidazolium hexafluorophosphate (e.g., [BMIM][PF6]), methylene chloride (e.g., as a solvent), a cation (e.g., one or more of [EMIM]+, [P$_{6,6,6,14}$]+, [BMIM]+, [N$_{1,8,8,8}$]+, [mpyr]+), an anion (e.g., one or more of [BF$_4$]—, [NTf2]-, [CF$_3$SO$_3$]—, [TFSA]-, [FAP]-, [DBSA]-, [PF$_6$]—, [DCA]-, [TOS]-, [AlCl4]-), and paramagnetic molecules (e.g., terpyridinyl ligands) complexing a magnetic ion (e.g, (Co) PDOT:PSS). Some substrates may be substantially elastic such that when a magnetic field is applied and subsequently removed, the substrate is sufficiently elastic to reset the orientation of the magnetic elements to the orientation before the magnetic field was applied. In other implementations, the suspension is substantially plastic in that if a magnetic field is applied to and subsequently removed from, the changes to orientations of the magnetic elements remain. The properties of the suspension substrate (e.g., elasticity, conductivity, magnetic dipole, or viscosity) may be controlled at manufacture such that predefined conditions or thresholds are established to map rotational responses of magnetic elements to magnetic fields applied. The conditions or thresholds may be based on a resulting measured resistance rather than discerning the extent of rotation of the magnetic elements or the extent to which the magnetic elements are ordered or aligned (as opposed to randomly scattered or antiparallel to the direction of opposing conductive elements that provide the current). Within a single device, magnetoresistive wells may differ in substrate composition and/or the types or properties of the suspended magnetic elements.

The presently disclosed technology demonstrates implementations of MMR wells that can be manufactured more simply with higher tolerances and specific applications of these magnetoresistive wells. One application contemplated by this specification is the use of the MMR element as a sensor. The sensor may be placed near a magnetic field to determine a metric of the magnetic field including one or more of the direction and magnitude of the applied magnetic field being sensed by measuring the electrical resistance across one or more magnetoresistive wells to which the magnetic field to be measured is exposed. A specific implementation of this MMR sensor is an MMR element used to read data from a hard disk drive, solid-state drive, or other memory device (e.g., in a read/write head assembly). In this implementation, it may be desirable to use substantially elastic magnetoresistive wells (ones with substantially elastic substrates), such that when the magnetic field to be measured is removed, the magnetic elements reset to a baseline position. Plastic magnetoresistive wells (ones with substantially plastic substrates) may also be used for this application as well. For example, between sensor readings, the magnetoresistive wells can be reset to a particular orientation either using a relatively powerful magnetic field that aligns the particles or by using a feedback mechanism to determine when the magnetoresistive wells have a predefined electrical resistance that correlates (e.g., by customized configuration) with a starting orientation of the magnetic elements in suspension.

Another application of the disclosed magnetoresistive wells presented in this specification is for data storage in memory devices. Each magnetoresistive well or multiple magnetoresistive wells may function as data storage memory elements or MMRbits. Predefined magnetic fields may be applied to the MMRbits in order to modify data written to the MMRbits. Electrical resistance can be detected or measured across an MMRbit, and the electrical resistance may represent a particular data state or value. For example, a first resistance may indicate a value of one, and a second resistance may indicate a value of zero. Because the data state of each MMRbit is based on the orientation of the magnetic elements in suspension and the corresponding measured resistance across the MMRbit, the number of interpretable data states for each MMRbit is less limited than traditional bits. That is, the MMRbit may be a higher level bit interpretable to represent more than the typical two data states of traditional bits. Depending on, for example, the resolution and tolerances of the equipment used to apply the magnetic field, to clearly present different data states by the orientation of magnetic elements responsive to the applied field, and to measure the electrical resistance of magnetoresistive wells of the MMRbit, the MMRbit can represent many data states in a single MMRbit. The MMRbit may represent different data state values with different ranges of electrical resistances across the magnetoresistive well. For example, a first range of electrical resistance values (or a particular electrical resistance value within a tolerance) may represent a zero, a second may represent a one, a third may represent a two, a fourth may represent a three, etc. An MMRbit may benefit from the use of plastic magnetoresistive wells. With plastic magnetoresistive wells, a writing operation can apply a magnetic field to modify the data, remove the field, and the data is maintained. If the MMRbit has elastic magnetoresistive wells, modifying data may require the continued application of a magnetic field to magnetoresistive wells to maintain the modified data state. While this implementation is contemplated, the interpretation of memory in the magnetoresistive wells may be a redundant operation, as the maintaining of the magnetic field itself could function as memory independently of the MMR properties of the MMRbit.

FIG. 1 illustrates example MMR devices 100A, 100B, and 100C of an MMR system. MMR device 100A includes a magnetoresistive well 102A. While illustrated as one magnetoresistive well 102A, multiples of the magnetoresistive well 102A may be deployed (and may or may not be in electrical communication with one another in any number of dimensions and configurations). The magnetoresistive well 102A may include a suspension substrate 106A and magnetic elements 104A suspended in the suspension substrate 106A. The magnetic elements 104A are illustrated as having magnetic poles, represented by the dark and light portions of the magnetic elements. Each instance of the magnetoresistive well 102A may be electronically coupled to a first conductive element 110A and a second conductive element 112A. The first conductive element 110A may be coupled to the magnetoresistive well 102A at a first position or first portion of the magnetoresistive well 102A and the second conductive element 112A may be coupled to the magnetoresistive well 102A at a different second position or second portion. The first position or first portion may substantially oppose the second position or second portion relative to the magnetoresistive well 102A. The coupling of the first conductive element 110A and the second conductive element 112A with the magnetoresistive well 102A may include one or more of a physical coupling and an electrical coupling.

The MMR device 100A illustrates an implementation before a magnetic field is applied. MMR device 100A has magnetic elements 104A oriented in parallel with the first conductive element 110A and the second conductive element 112A. MMR device 100B is an implementation of MMR device 100A to which a magnetic field 103 is applied by magnetic field source 101. In various implementations, the magnetic field source 101 may be one or more of a magnetic field source to be measured or a magnetic field emitter adapted to emit a predefined magnetic field to modify a data state of an MMRbit for which the magnetoresistive well 102B is a data element. Depending on the application, the magnetic field 103 may be predefined and selectively applied by a system with a processor and memory to modify data in accordance with instructions. In an additional or alternative implementation, the magnetic field 103 may be a quantity to measure based on changes in orientation of the magnetic elements 104B responsive to the applied magnetic field. As illustrated, the magnetic field 103 applied to the magnetoresistive well 102B changes the orientation of the magnetic elements 104B to be diagonally oriented relative to the first conductive element 110B and the second conductive element 112B. The measured electrical resistance across the magnetoresistive well 102A in MMR device 100A will differ from the measured electrical resistance across the magnetoresistive well 102B of MMR device 100B because the orientation of the magnetic elements 104A differs from the orientation of the magnetic elements 104B (even if by composition the elements are identical). Implementations are contemplated in which the suspension substrate 106B is more conductive than the magnetic elements 104B, such that a change in orientation of the magnetic elements 104B changes the conductive cross-section of the suspension substrate 106B, thereby modifying the measurable resistance across the magnetoresistive well 102B. The electrical resistance may be measured by any known resistance measurement element (e.g., an ohmmeter, a Wheatstone bridge, or a four-point probe).

Implementations are contemplated in which application of a magnetic field to the magnetic elements 104B will cause the magnetic elements 104B to assemble and form a cohesive unit. For example, the magnetic elements 104B may include small particles (e.g., nanoparticles) that assemble when a magnetic field is applied to make one or more large cohesive units. If the cohesive units are more conductive than the suspension substrate 106B, the cohesive units may function as a wire that can be selectively organized to form a conductive connection between the first conductive element 110B and the second conductive element 112B. Alternatively, if the cohesive units are less conductive than the suspension substrate 106B, the cohesive units may be assembled to form a barrier resistive barrier to current transmitted between the first conductive element 110B and the second conductive element 112B.

A computing system including a processor and memory (e.g., an implementation of computing system 1000) for conducting logic operations may control the operations of the MMR device 100A, 100B. The MMR device 100A, 100B may include one or more of a computing system or computer-readable media (e.g., non-transitory data storage media) that store modules for the operation of the MMR device 100A or 100B. These modules may be executable by a computing system (e.g., computing system 1000). These modules may include a resistance measuring module that measures resistance across one or more instances of the magnetoresistive wells 102A or 102B, magnetic field application modules that apply predefined electromagnetic fields to one or more instances of the magnetoresistive wells 102A or 102B, electrical input modules that introduce electrical input to a first conductive element 110B (e.g., introducing a predefined current and/or voltage), and the like. Operations, intermediates, instructions, and predefined relationships may be elements of an MMR device module specific to an application. For example, in an MMR memory device application, the MMR memory device may have an MMR memory module that is responsible for reading or writing data states to magnetoresistive wells. In an MMR sensor device application, the MMR sensor device may include an MMR sensor module that determines a metric (e.g., magnitude and/or direction) of a magnetic field based on a measured resistance. The MMR device modules may be stored in data storage media (e.g., computer-readable non-transitory storage media that do not include signals per se) and may be executable by a processor of a computing system (e.g., computing system 1000) that may be integrated with or otherwise communicatively coupled to the data storage media.

In applications where the MMR device 100B is used as a magnetic sensor, the computing system may one or more of control the electrical input applied (e.g., electrical current and/or potential) to the magnetoresistive well 102B, receive a measurement of or measure a resistance across the magnetoresistive well 102B (e.g., based on the electrical input and the responsive electrical output), interpret the received measure of resistance to determine a property of a magnetic field 103 to be measured (e.g., based on a predefined relationship between the magnetic field 103 and the measured electrical resistance), instruct an element to apply a supplemental magnetic field, determine a value of an electrical resistance parameter based on a measured electrical resistance, and the like. The resistance may be determined from values of the current and the potential or voltage passed through the magnetoresistive well (e.g., using Ohm's law). Electrical input may be measured at the first conductive element 110B and responsive electrical output may be measured at the second conductive element 112B. That is, the current may be measured at one of the first conductive element 110B or the second conductive element 112B, and the potential may be measured as a potential difference between the first conductive element 110B and the second conductive element 112B. Changes in measured electrical resistance may indicate a change in orientation of the magnetic elements 104B and, therefore, changes in the field applied to the magnetoresistive well 102B.

In applications where the MMR device 100B is used as a memory element, the computing system may be one or more of a control current through or potential applied to the magnetoresistive well 102B, control the magnetic field 103 applied to the magnetoresistive well 102B (e.g., at a predefined level to modify data), interpret the received measure of resistance to determine a data state of the MMR device 100B (e.g., based on a predefined relationship between the magnetic field 103 applied and the measured electrical resistance), instruct an element to apply a supplemental magnetic field, determine a value of an electrical resistance parameter based on a measured electrical resistance, and the like. Data states can be related in predefined data to predefined ranges of magnetoresistance or other resistance values. As such, if a magnetoresistive well has a particular magnetoresistance or resistance value within a predefined range (or close to a predefined value), the magnetoresistive well (or series of wells) may be interpreted to represent a corresponding data state (e.g., a predefined data state). These values can be binary zeroes and ones or can represent higher values. For example, if six ranges (or values) of magnetoresistance and/or electrical resistance are used, each range can represent a data state (e.g., can assume values of zero, one, two, three, four, or five). Once interpreted, the data states of the MMRbits represent data values that may otherwise be represented by other types of bits.

Although the magnetic elements 104B are illustrated as merely rotating without translational motion in MMR device 100B, (e.g., the magnetic elements 104B are suspended such that they may only rotate but not move locations), implementations are contemplated in which the magnetic elements may migrate, rather than remaining at a same position, from one side of a magnetoresistive well 102B to another side of the magnetoresistive well. For example, as illustrated with respect to MMR device 100C, magnetic field source 101 applies a magnetic field 103 on the side of the MMR device 100C. Magnetic elements 104C migrate through the suspension substate 106C to the side of the magnetoresistive well 102C to which the magnetic field 103 is applied. A third conductive element 114C which is substantially adjacent to a first conductive element 110C has improved conductivity because the magnetic elements 104C with conductive properties have migrated to aggregate between the first conductive element 110C and the third conductive element 114C. If the magnetic field 103 were reversed, the magnetic elements 104C would migrate to the other side and improve conductivity between a second conductive element 112C and a fourth conductive element 116C. In implementations in which the MMR device 100C is used as a memory element, depending on which side has better conductivity, a memory value could be assigned to the magnetoresistive well 102C, and the value could be modified by applying a different magnetic field. In implementations where the MMR device 100C is an element of a sensor, the side with the better conductivity can be used to determine a direction of a magnetic field 103 applied.

Figure 2:
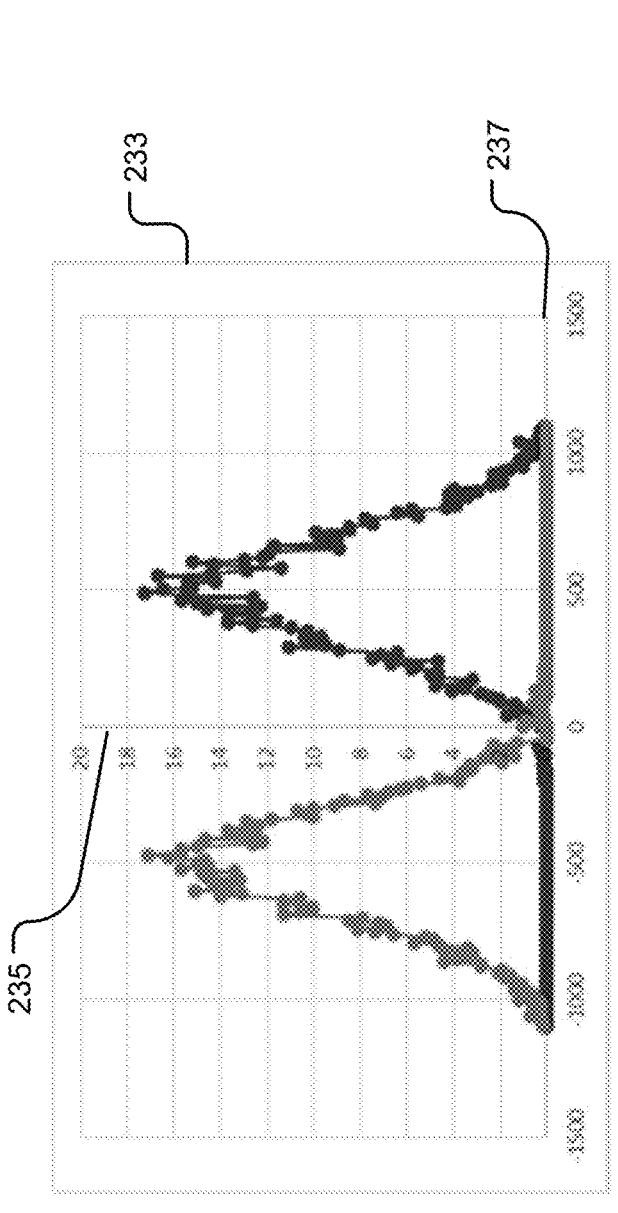
FIG. 2 illustrates another example of an implementation of MMR systems.
Figure 2:
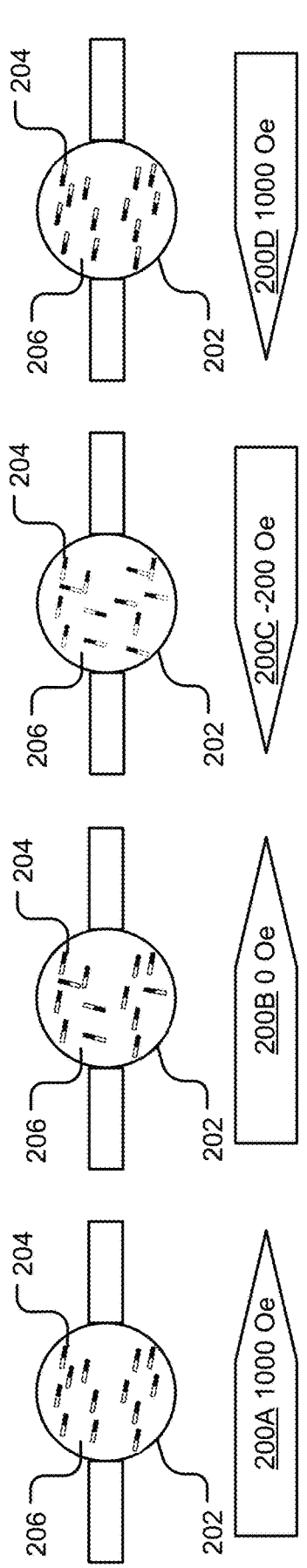

FIG. 2 illustrates another example of an implementation of MMR systems 200A-D. The illustrated implementation demonstrates the manner in which a change in a magnetic field changes the orientation of the magnetic elements and resulting measurements. Each system has a magnetoresistive well 202 with suspension substrate 206 and magnetic elements 204 suspended in the suspension substrate 206. Specifically, in system 200A, a magnetic field with a magnitude of 1000 Oersteds (Oe) and a first direction (illustrated as a direction to the right being positive). As can be seen, when this field is applied, the magnetic elements 204 align with the magnetic field. In some implementations, this alignment may cause connections to form between magnetic elements 204 or generate conductive paths through the suspension substrate 206. The suspension substrate 206 may be less electrically conductive than the magnetic elements 204 such that when the magnetic elements 204 align in parallel with the conductive elements through which a current is passed or to which a potential is applied, the conductivity across the well (e.g., between the conductors) is higher and the resistance lower than when the magnetic elements 204 are randomly arranged or arranged antiparallel to the conductive elements. At this level, the magnetoresistive well 202 has a maximum conductivity and a minimum resistance (consistent with the magnetic elements 204 being parallel with the conductive elements). In an alternative implementation, the suspension substrate 206 may be more electrically conductive than the magnetic elements 204 such that, when the magnetic elements 204 are unarranged relative to or antiparallel to the conductive elements (e.g., reducing the conductive cross-section within the suspension substrate 206), the magnetic elements may present greater resistance to current across the magnetoresistive well 202. In system 200B, the magnetic field is deactivated, illustrated as 0 Oe in the positive direction. In response to this modification to the magnetic field (or a gradual transition towards it where intermediary magnitudes and directions of magnetic fields are applied), the orientation of the magnetic elements 204 is less ordered. This lower ordering will increase the resistance across the magnetoresistive well 202. A graph 233 represents a plot of the magnetoresistance to the electrical resistance.

Magnetoresistance (e.g., MMR or GMR) can be calculated using equation 1:

$$MMR = \frac{\Delta R}{R_{min}} = \frac{R_{max} - R_{min}}{R_{min}} \qquad (1)$$

Implementations are also contemplated in which $R_{max}$ is used in the denominator. In an implementation, maximum resistance $R_{max}$ may be an electrical resistance across the magnetoresistive well 202 obtained for the highest degree of disorder when the magnetic moments of the magnetic elements 204 are statistically distributed without a field or, alternatively, may represent the electrical resistance when the magnetic poles of the elements are arranged in a direction antiparallel or orthogonal to the field applied. Minimum resistance $R_{min}$ may be an electrical resistance that is measured when the alignment of the single moments of the magnetic elements 204 are in the direction of the magnetic field. In an implementation, $R(H)=R_{max}$ is the measured resistance across the magnetoresistive well 202 for a magnetic field vector, H, and $R(0)=R_{min}$ is the resistance when the magnetic field vector, H, is has a magnitude of zero. In implementations, measurements of resistivity may be used instead of or in addition to measurements of electrical resistance. In implementations where the magnetoresistive wells have orthogonal sets of opposing conductive elements, applying a large magnetic field in the direction of one of the sets may help to orient the magnetic elements 204 in a direction parallel to one set of opposing conductive elements and orthogonal to another set. In an implementation, measuring electrical resistance across the parallel set of conductive elements may provide a value of $R_{min}$ for the magnetoresistive well, and measuring the electrical resistance across the orthogonal set of conductive elements may provide a value of $R_{max}$.

The ordinate 235 of the graph represents the magnetoresistance of the MMR systems 200A-D (e.g., in this implementation, a unitless value). The abscissa 237 represents a magnitude (e.g., the magnitude illustrated in units of Oersteds or Oe) and direction (in the illustrated example in a single dimension with directions represented as positive or negative directions) of a magnetic field applied to the magnetoresistive well 202. Looking at the graph 233 relative to the systems 200A-200D, MMR responses to the applied fields are illustrated.

In the transition from the system 200B to system 200C, the system has a 200 Oe field applied in the direction opposite to that of the system 200A. Here, the magnetic elements 204 begin to reorient themselves to align their poles with the applied −200 Oe magnetic field. In system 200D, a −1000 Oe field is applied, and the magnetic poles of the magnetic elements 204 are aligned in the opposite direction from the poles of the magnetic elements 204 in system 200A. The corresponding magnetoresistance changes are represented in the graph 233. The lighter scatter curve represents an applied magnetic field swept from a negative field to a positive field. The darker scatter curve represents an applied magnetic field swept from a positive field to a negative field.

Figure 3:
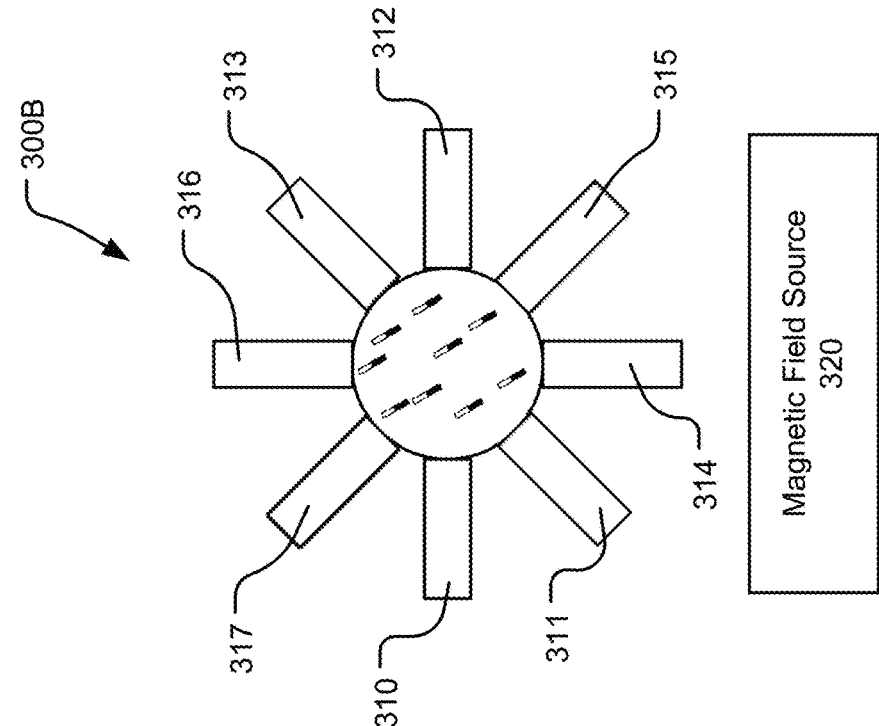
FIG. 3 illustrates still another example of an implementation of MMR systems.
Figure 3:
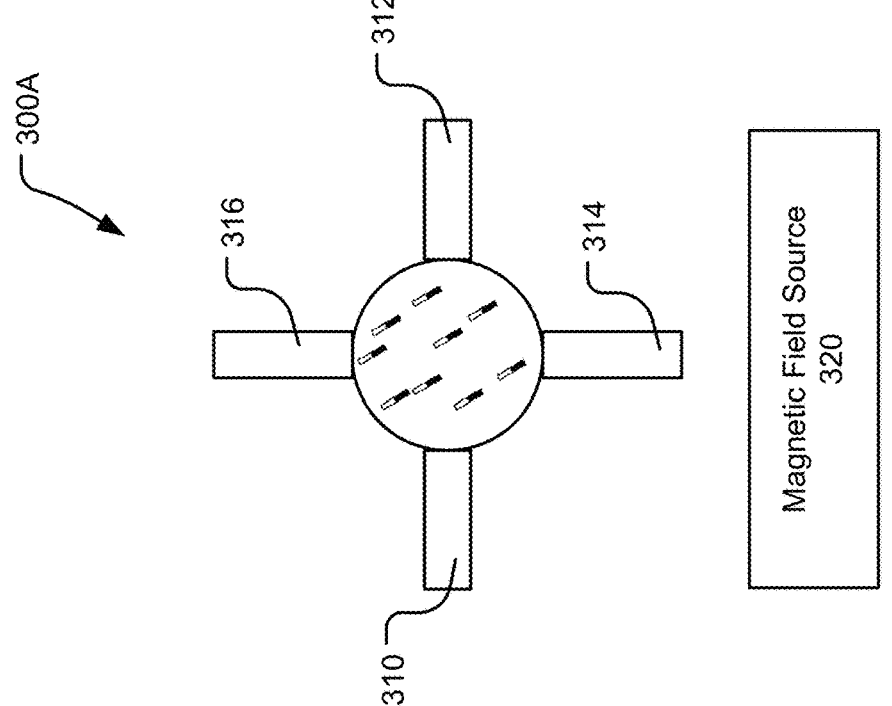

FIG. 3 illustrates still another example of an implementation of MMR systems 300A, 300B. The resistance of a magnetoresistive well may be direction-dependent in more than one dimension. For example, MMR systems 300A, 300B illustrate examples where magnetoresistance is measured in more than one direction across the magnetoresistive wells. In MMR system 300A, the conductive elements 310 and 312 are arranged to oppose one another relative to the magnetoresistive well along a first axis. Similarly, the conductive elements 314 and 316 are arranged to oppose one another along a second axis. MMR system 300B further includes conductive elements 315 and 317 that oppose one another along a third axis and conductive elements 311 and 313 that oppose one another along a fourth axis. In various implementations, one or more of the axes of the opposing conductive element pairs may have relative orientations of orthogonal, antiparallel, parallel, diagonal, and the like. For example, the axis of the pair of opposing conductive elements 310 and 312 is orthogonal to the axis of the pair of opposing conductive elements 314 and 316. Similarly, the axis of the pair of opposing conductive elements 311 and 313 is orthogonal to the axis of the pair of opposing conductive elements 315 and 317. The axis of the pair of opposing conductive elements 310 and 312 and the axis of the pair of opposing conductive elements 314 and 316 an angled relationship (neither parallel nor orthogonal) relative to the axis of the pair of opposing conductive elements 311 and 313 and relative to the axis of the pair of opposing conductive elements 315 and 317. These axes may also be oriented in a predefined orientation relative to a predefined or expected magnetic field direction.

In implementations, electrical current may be passed through (and/or an electrical potential may be applied across) the magnetoresistive well from a conductive element of a set of opposing conductive elements to the other of the set (e.g., along an axis). This may be done over time intervals that do or do not overlap with time intervals over which an electrical current is passed through the magnetoresistive well from a different set of opposing conductive elements. Electricity may be passed through each conductive element pair and measured at non-overlapping time intervals where electricity is passed only through a single set of (opposing) conductive elements. As illustrated in MMR system 300A, the conductive element pairs may be along axes that are one or more of orthogonal to or parallel with a magnetic field applied by a magnetic field source 320. As illustrated in MMR system 300B, an axis of conductive element pairs may be arranged in diagonal or other directions relative to magnetic field source 320. Greater numbers of conductive element pairs in different orientations can potentially improve resolution for measurements of a direction of a magnetic field applied (based on the measured resistances between the conductive element pairs).

Figure 4:
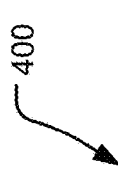
FIG. 4 illustrates an example of an implementation of an MMR system with magnetoresistive wells in series.
Figure 4:
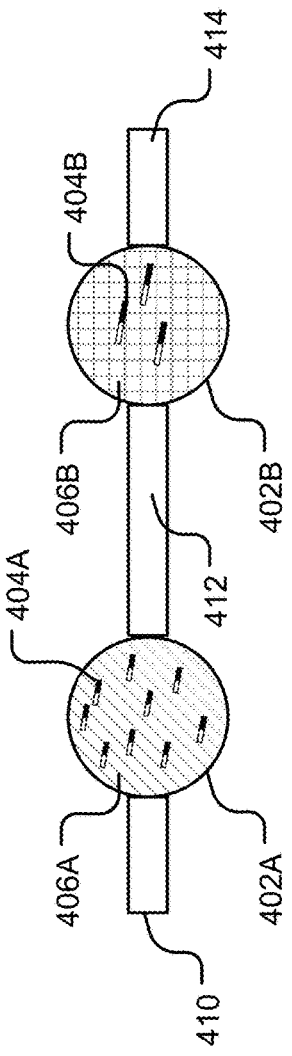

FIG. 4 illustrates an example of an implementation of an MMR system 400 with magnetoresistive wells in series. A first magnetoresistive well 402A and A second magnetoresistive well 402B are coupled by a common conductive element 412, with each having an external conductive element 410, 414 to be in electronic communication with an external system (e.g., one used to measure electrical resistance through one or more of the first magnetoresistive well 402A and the second magnetoresistive well 402B). The first magnetoresistive well 402A includes a first suspension substrate 406A and first magnetic elements 404A. The second magnetoresistive well 402B includes a second suspension substrate 406B and second magnetic elements 404B.

In various implementations, the first suspension substrate 406A and the second suspension substrate 406B may differ. For example, the composition of the first suspension substrate 406A may differ in composition and/or preparation from the second suspension substrate 406B (the difference illustrated as different fill patterns). The relative compositions of the suspension substrates 406A and 406B may provide further resolution between different measurements. While shown arranged in series and connected, the first magnetoresistive well 402A and the second magnetoresistive well 402B with suspension substrates 406A, 406B of different composition may be separated by one or more other magnetoresistive wells (not illustrated) and/or differently angled or arranged relative to one another and to one or more other magnetoresistive wells (not illustrated). In an implementation, the suspension substrates 406A and 406B may be composed of different materials or different concentrations of the same materials. The compositions may be adapted to provide specific physical characteristics, such as predefined one or more of conductivity, dipole, elasticity, plasticity, and the like. Some suspension substrates 406A, 406B may be substantially elastic such that when a magnetic field is applied and subsequently removed, the suspension substrates 406A, 406B are sufficiently elastic as to reset the orientation of the magnetic elements 404A, 404B to the orientation before the magnetic field was applied. In other implementations, the suspension substrates 406A, 406B are substantially plastic in that if a magnetic field is applied to and subsequently removed from the magnetoresistive well 402A, 402B, the changes to orientation of the magnetic elements 404A, 404B remains. The properties of the suspension substrate 406A, 406B (e.g., elasticity, conductivity, magnetic dipole, or viscosity) may be controlled at manufacture such that predefined conditions or thresholds are established to map rotational responses of magnetic elements to magnetic fields applied. The conditions or thresholds may be based on a resulting measured resistance rather than discerning the extent of rotation of the magnetic elements 404A, 404B or the extent to which the magnetic elements 404A, 404B are ordered or aligned (as opposed to randomly scattered or antiparallel to the direction of opposing instances of the external conductive element 410, 414 that provide the current). Within a single device, magnetoresistive wells 402A, 402B may differ in suspension substrate 406A, 406B composition.

The magnetic elements 404A and 404B may differ between the magnetoresistive wells 402A, 402B within a single device. For example, the magnetic elements 404A and 404B may differ in size, configuration, number, arrangement, and/or composition. For example, as illustrated, the second magnetic elements 404B are larger and fewer in number than the first magnetic elements 404A. Electrical measurements (e.g., resistance or magnetoresistance) may be taken across one or more of the magnetoresistive wells 402A, 402B.

Figure 5:
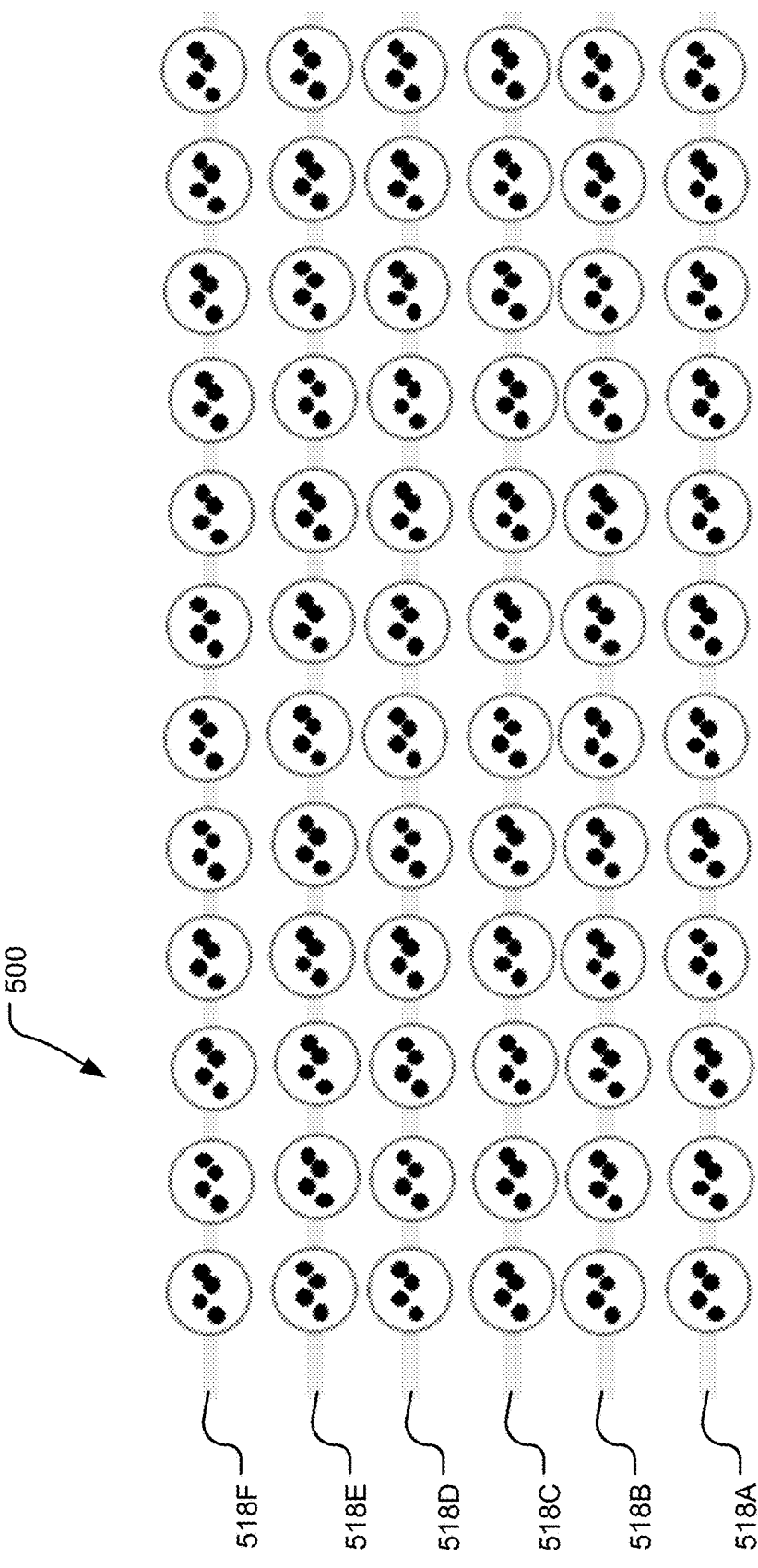
FIG. 5 illustrates an example implementation of a two-dimensional array MMR system.

FIG. 5 illustrates an example of a two-dimensional array implementation of an MMR system 500. The MMR system 500 has parallel rows 518A-518F of magnetoresistive wells. The magnetoresistive wells of each of rows 518A-518F may be connected in series and may be measured as a whole (e.g., resistance across multiple magnetoresistive wells, aligned for example in a direction) or may measure a resistance across each magnetoresistive well. While illustrated as only in series in a particular direction (e.g., horizontally as illustrated), there may be further cross-linking between magnetoresistive wells along orthogonal or diagonal directions relative to the horizontal direction illustrated. The arrays may be elements on a circuit board or may be elements of a wire. For example, each row 518A-F may be a separate wire.

The MMR system 500 may include an MMR device of which the magnetoresistive wells are components. The MMR device may be partially or completely enclosed in an enclosure. The enclosure may have magnetic shielding in order to prevent errant magnetic fields from affecting the shielded magnetoresistive wells. For example, in an MMR sensor device implementation, the enclosure may magnetically shield the magnetoresistive wells in all directions except a direction from which the magnetic field to be measured is emitted. In an MMR memory device implementation, the MMR memory device may be completely enclosed to prevent interaction with external magnetic fields. Further, implementations are contemplated in which internal magnetic field shielding is provided between magnetoresistive wells within the same MMR device.

Figure 6:
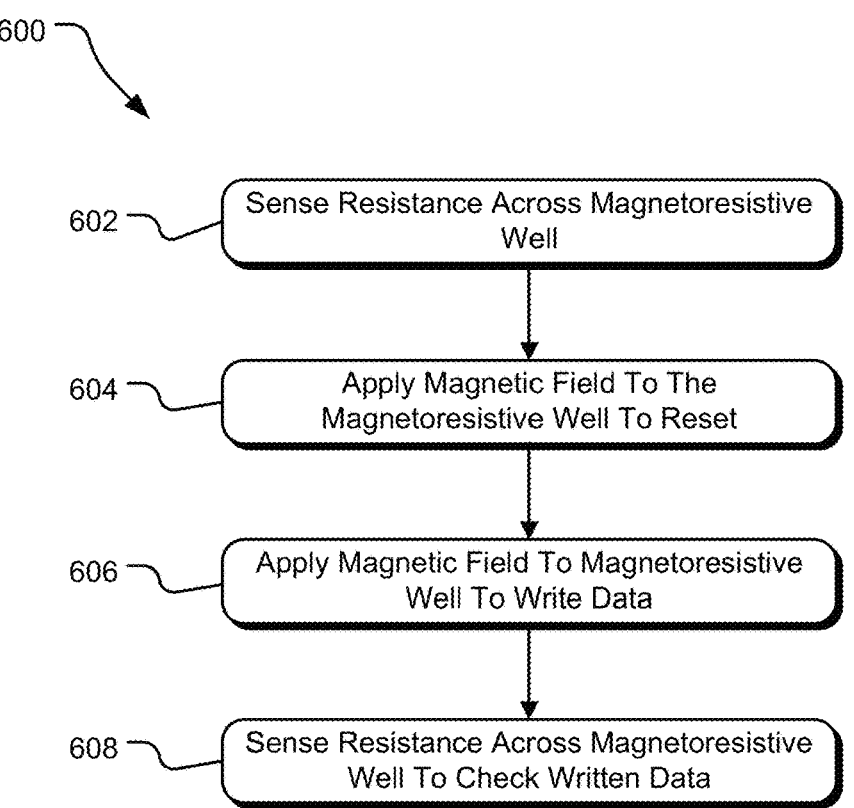
FIG. 6 illustrates example operations for writing data to an MMR memory device.

FIG. 6 illustrates example operations 600 for writing data to an MMR memory device. Sensing operation 602 senses an electrical resistance across a magnetoresistive well. The sensed electrical resistance can be used to determine a magnetoresistance parameter such as a magnetoresistance (e.g., determinable using equation 1). Sensing operation 602 may include sensing one or more of a maximum resistance and a minimum resistance across a magnetoresistive well. $R_{max}$ is an electrical resistance across the magnetoresistive well obtained for the highest degree of disorder when the magnetic moments of the magnetic elements are statistically distributed without a field. $R_{max}$ may represent the electrical resistance across the magnetoresistive well when poles of the magnetic elements are orthogonal to the direction of an applied magnetic field. $R_{min}$ is an electrical resistance that is measured when the alignment of the single moments of the magnetic elements are in the direction of the magnetic field. $R_{min}$ may represent the electrical resistance across the magnetoresistive well when magnetic poles of magnetic elements are parallel to the direction of an applied magnetic field. In an implementation, $R(H)=R_{max}$ is the measured resistance across the magnetoresistive well for a magnetic field vector, H, and $R(0)=R_{min}$, is the resistance when the magnetic field vector, H, has a magnitude of zero. In implementations, measurements of resistivity may be used instead of or in addition to measurements of resistance (e.g., with different weighting). In implementations where the magnetoresistive wells have orthogonal sets of opposing conductive elements, applying a large magnetic field in the direction of one of the sets may help to orient the magnetic elements in a direction parallel to one set of opposing conductive elements and orthogonal to another set. Measuring electrical resistance across the parallel set of conductive elements may provide a value of $R_{min}$ for the magnetoresistive well, and measuring the electrical resistance across the orthogonal set of conductive elements may provide a value of $R_{max}$. In various implementations, the memory device may erase any current data to return the magnetoresistive well to a baseline data state before writing new information. In this implementation, sensing operation 602 may be omitted.

Applying operation 604 applies a magnetic field to the magnetoresistive well to reset. The system may use a specific measure of resistance as a baseline (e.g., default, zero, or unwritten) value. In some implementations, before a write operation is conducted to write to the magnetoresistive cell, the system may provide a magnetic field to reset the magnetic elements of a magnetoresistive well to positions that represent the baseline value. This may allow for a clean memory cell to which data can be written. If a magnetic field is of sufficient magnitude, the magnetic elements may completely align with the applied magnetic field. Alternatively or additionally, may, based on the sensed resistance across the magnetoresistive well, determine a magnetic field to apply to modify the orientation of the magnetic elements from a current orientation that represents a current data state to a different orientation that represents a different data state (e.g., from a non-baseline data state to another non-baseline data state). In this type of implementation, applying operation 604 may be omitted.

Applying operation 606 applies a magnetic field to the magnetoresistive well to write data. A predefined magnetic field may be applied to the magnetoresistive well to correspondingly write a data state by modifying the orientation of the magnetic elements in the magnetoresistive well. The magnetic field applied may be predefined relative to a current magnetic element orientation that represents a current data state or may be from a reference baseline value (e.g., if it is a first write or writing involves a reset operation at each write as described with regard to applying operation 604). The computer-readable media that store instructions to accomplish the operations 600 may be executed by the processors to reference data tables and/or values calculated using equations to relate one or more of measured resistances, magnetoresistances, and data states of one or more magnetoresistive wells. For example, a particular range or value of electrical resistance or magnetoresistance may correspond with a value of a data state (e.g., as a value of an MMRbit).

Sensing operation 608 senses resistance across the magnetoresistive well to check written data. Sensing operation 608 may be an element of a feedback mechanism to ensure that an appropriate data state has been written. In this implementation, writing may be an iterative process, such that the resulting resistance values are checked against target resistance values. Alternatively or additionally, the sensing operation 608 may check the result with no iterative process, and if the value does not match a target value, the magnetoresistive well may be reset (e.g., by applying operation 604), and a predefined magnetic field is applied to try again (e.g., by the applying operation 606). Sensing operation 608 may be conducted similarly to sensing operation 602. In implementations where no check of the data is made and/or no feedback mechanism is used, sensing operation 608 may be omitted.

The operations 600 may be conducted by a computing system (e.g., computing system 1000). The operations 600 may be stored in computer-readable non-transitory storage media and operable to be executed by a processor of a computing system (e.g., computing system 1000). The instructions and predefined relationships to conduct operations 600 may be stored in an MMR memory module.

Figure 7:
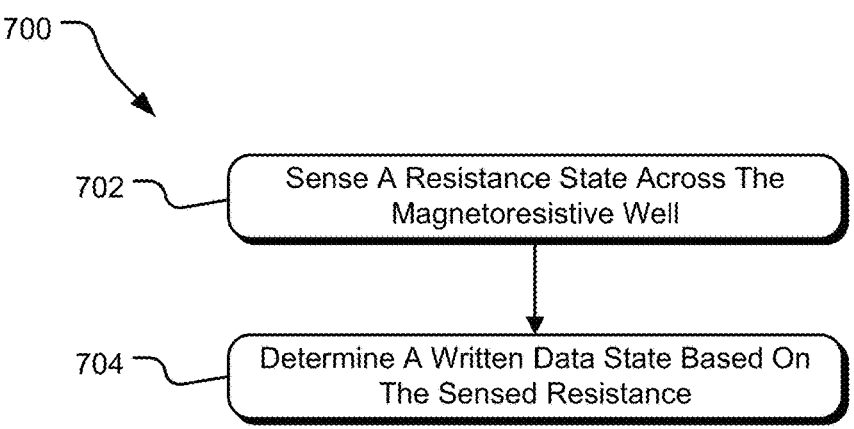
FIG. 7 illustrates example operations of reading data from an MMR memory device.

FIG. 7 illustrates example operations 700 of reading data from an MMR memory device. Sensing operation 702 senses a resistance across a magnetoresistive well. Sensing operation 702 may include sensing one or more of a maximum resistance and a minimum resistance across a magnetoresistive well. $R_{max}$ is an electrical resistance across the magnetoresistive well obtained for the highest degree of disorder when the magnetic moments of the magnetic elements are statistically distributed without a field. $R_{max}$ may represent the electrical resistance across the magnetoresistive well when poles of the magnetic elements are orthogonal to the direction of an applied magnetic field. $R_{min}$ is an electrical resistance that is measured when the alignment of the single moments of the magnetic elements are in the direction of the magnetic field. $R_{min}$ may represent the electrical resistance across the magnetoresistive well when magnetic poles of magnetic elements are parallel to the direction of an applied magnetic field. In an implementation, $R(H)=R_{max}$ is the measured resistance across the magnetoresistive well for a magnetic field vector, H, and $R(0)=R_{min}$ is the resistance when the magnetic field vector, H, has a magnitude of zero. In implementations, measurements of resistivity may be used instead of or in addition to measurements of resistance (e.g., with different weighting). In implementations where the magnetoresistive wells have orthogonal sets of opposing conductive elements, applying a large magnetic field in the direction of one of the sets may help to orient the magnetic elements in a direction parallel to one set of opposing conductive elements and orthogonal to another set. Measuring electrical resistance across the parallel set of conductive elements may provide a value of $R_{min}$ for the magnetoresistive well and measuring the electrical resistance across the orthogonal set of conductive elements may provide a value of $R_{max}$.

Determining operation 704 determines a written data state based on the sensed resistance. The written data state may be reflected in a predefined relationship between one or more of electrical resistance and magnetoresistance and a data state. Data states can be related in this predefined data to predefined ranges of magnetoresistance or other resistance values. As such, if a magnetoresistive well has a particular magnetoresistance or resistance value within a predefined range (or close to a predefined value), the magnetoresistive well (or series of wells) may be interpreted to represent a corresponding data state. These values can be binary zeroes and ones or can represent higher values. For example, if six ranges (or values) of magnetoresistance and/or electrical resistance are used, each range can represent a data state (e.g., can assume values of zero, one, two, three, four, or five. Once interpreted, the data states of the MMRbits represent data values that may otherwise be represented by other types of bits.

The operations 700 may be conducted by a computing system (e.g., computing system 1000). The operations 700 may be stored in computer-readable non-transitory storage media and operable to be executed by a processor of a computing system (e.g., computing system 1000). The instructions and predefined relationships to conduct operations 700 may be stored in an MMR memory module.

Figure 8:
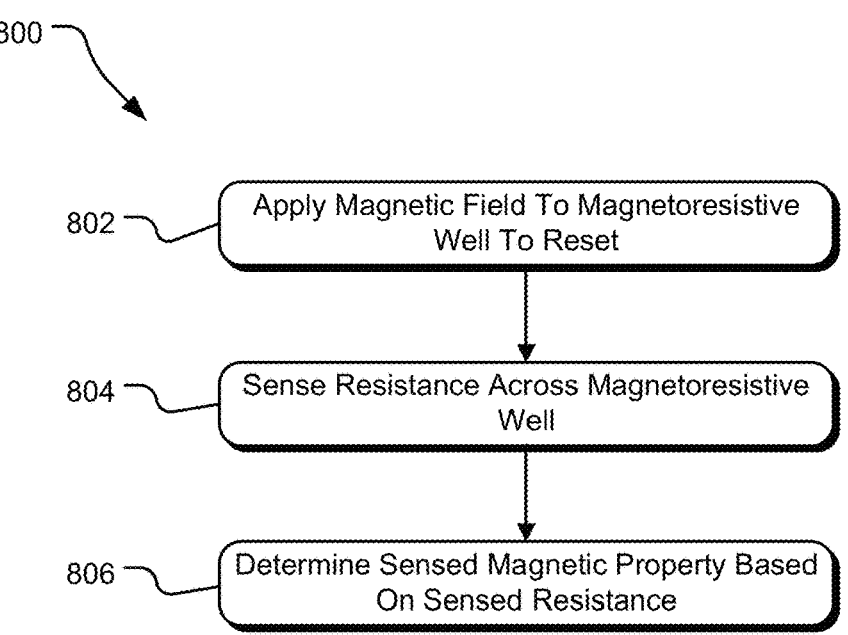
FIG. 8 illustrates example operations of sensing magnetic fields using an MMR sensor device.

FIG. 8 illustrates example operations 800 of sensing magnetic fields using an MMR sensor device. Applying operation 802 applies a magnetic field to reset a magnetoresistive well. In an implementation, the sensor device resets the orientation of the magnetic elements to a baseline value in order to provide a firm, calibrated reference for the sensor. Implementations are also contemplated in which the magnetic elements are not reset between sensor readings and in which the applying operation 802 may be omitted. One such example may be in an elastic magnetoresistive well where the orientation of the magnetic elements in a magnetoresistive well restore to a baseline orientation when the magnetic field that altered the orientation is removed. Of course, in such systems, magnetic elements may shift with time (even in an elastic medium) such that applying operation 802 may be applied at will (e.g., for a calibration process), periodically (e.g., on a schedule or after a certain number of detections), or responsively to a stimulus (e.g., detection of an error). A confirmatory sensing operation may also occur to confirm that the applying operation 802 adequately reset the orientation of the magnetic elements.

Sensing operation 804 senses resistance across the magnetoresistive well. Electrical resistance can be measured across the magnetoresistive well (e.g., at conductive elements or opposing conductive elements electrically coupled to the magnetoresistive well). Sensing operation 804 may include sensing one or more of a maximum resistance and a minimum resistance across a magnetoresistive well. $R_{max}$ is an electrical resistance across the magnetoresistive well obtained for the highest degree of disorder when the magnetic moments of the magnetic elements are statistically distributed without a field. $R_{max}$ may represent the electrical resistance across the magnetoresistive well when poles of the magnetic elements are orthogonal to the direction of an applied magnetic field. $R_{min}$ is an electrical resistance that is measured when the alignment of the single moments of the magnetic elements are in the direction of the magnetic field. $R_{min}$ may represent the electrical resistance across the magnetoresistive well when magnetic poles of magnetic elements are parallel to the direction of an applied magnetic field. In an implementation, $R(H)=R_{max}$ is the measured resistance across the magnetoresistive well for a magnetic field vector, H, and $R(0)=R_{min}$ is the resistance when the magnetic field vector, H, has a magnitude of zero. In implementations, measurements of resistivity may be used instead of or in addition to measurements of resistance (e.g., with different weighting). In implementations where the magnetoresistive wells have orthogonal sets of opposing conductive elements, applying a large magnetic field in the direction of one of the sets may help to orient the magnetic elements in a direction parallel to one set of opposing conductive elements and orthogonal to another set. Measuring electrical resistance across the parallel set of conductive elements may provide a value of $R_{min}$ for the magnetoresistive well, and measuring the electrical resistance across the orthogonal set of conductive elements may provide a value of $R_{max}$.

Determining operation 806 determines a sensed magnetic property based on the sensed resistance. The electrical resistance measured may be used to determine a magnetic property or metric of a magnetic field sensed by the MMR sensor device, such as a direction and magnitude of a magnetic field. The determining operation 806 may determine a sensed magnetic property or metric of the magnetic field based on a predefined relationship between the magnetic property or metric of the magnetic field and the sensed electrical resistance. Magnetic field directionality may be more easily determined in MMR sensor devices having magnetoresistive wells with multidirectional resistance sensing and/or using magnetoresistive wells that differ in composition (e.g., differ in one or more of suspension substrate and magnetic elements).

The operations 800 may be conducted by a computing system (e.g., computing system 1000). The operations 800 may be stored in computer-readable non-transitory storage media and operable to be executed by a processor of a computing system (e.g., computing system 1000). The instructions and predefined relationships to conduct operations 800 may be stored in an MMR sensing module.

Figure 9:
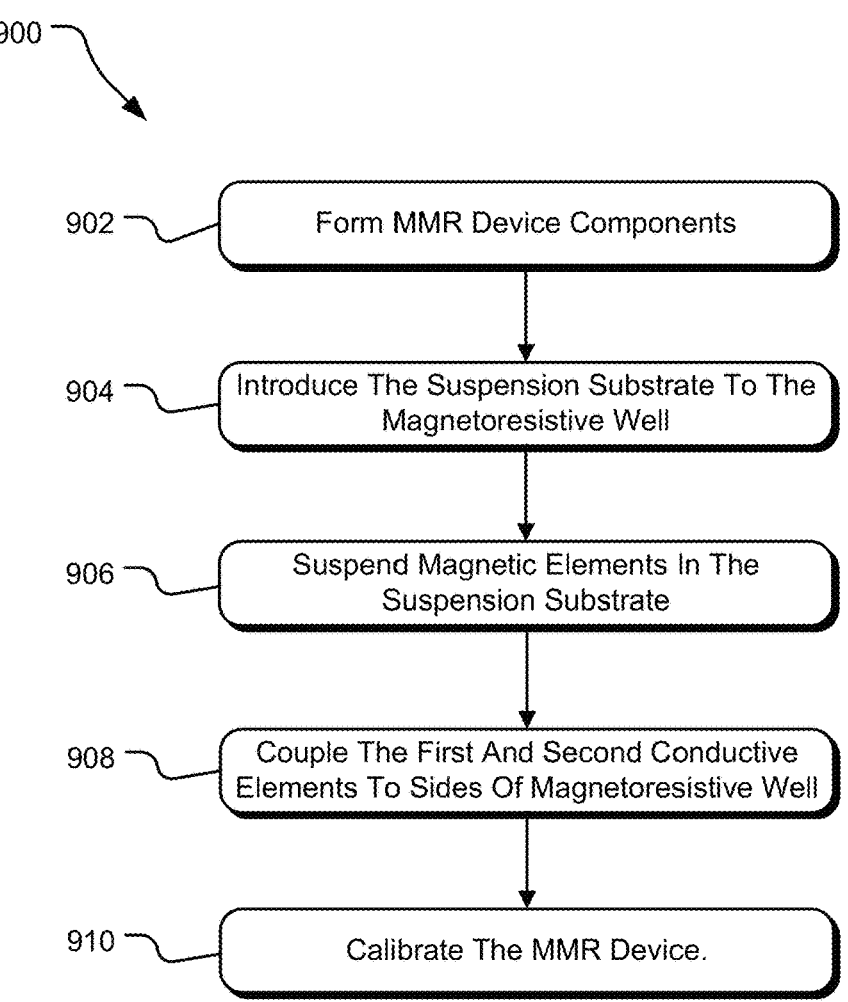
FIG. 9 illustrates example operations for making an MMR device.

FIG. 9 illustrates example operations 900 for making an MMR device. Forming operation 902 forms MMR device components. The components formed may include a magnetoresistive well, a suspension substrate, and magnetic elements.

Forming the substrate may involve a specific formulation. Some substrates may be substantially elastic such that when a magnetic field is applied and subsequently removed, the substrate is sufficiently elastic as to reset the orientation of the magnetic elements to the orientation before the magnetic field was applied. In other implementations, the suspension is substantially plastic in that if a magnetic field is applied to and subsequently removed from, the changes to orientation of the magnetic elements remain. The properties of the suspension substrate (e.g., elasticity, conductivity, magnetic dipole, or viscosity) may be controlled at manufacture such that predefined conditions or thresholds are established to map rotational responses of magnetic elements to magnetic fields applied. The conditions or thresholds may be based on a resulting measured resistance rather than discerning the extent of rotation of the magnetic elements or the extent to which the magnetic elements are ordered or aligned (as opposed to randomly scattered or antiparallel to the direction of opposing conductive elements that provide the current). Within a single device, magnetoresistive wells may differ in substrate composition. The magnetic elements may be formed and may differ between magnetoresistive wells within a single device. For example, the magnetic elements may differ in size, configuration, number, arrangement, and/or composition.

The forming operation 902 may be accomplished by manufacturing methods including molding, extruding, three-dimensional printing, circuit board printing, and the like.

Introducing operation 904 introduces the suspension substrate to the magnetoresistive well. Suspending operation 906 suspends the magnetic elements in the suspension substrate. Coupling operation 908 couples first and second conductive elements to sides (e.g., opposing sides) of the magnetoresistive well. The coupling operation may include both physical and electrical coupling of the conductive elements to the magnetoresistive well. Calibrating operation 910 calibrates the MMR device. The calibrating operation 910 may include one or more of applying a magnetic field to the magnetoresistive well, applying an electrical input to the first conductive element, measuring an electrical output responsive to the electrical input, and determining one or more of a minimum resistance and a maximum resistance based on a difference between the electrical input and the measured electrical output. The calibrating operation 910 may be repeated for different magnetic fields applied and for different currents applied to create a predefined relationship table that relates one or more of magnetic fields, electrical resistances, and magnetoresistances.

The operations 900 may be conducted by a computing system (e.g., computing system 1000). The operations 900 may be stored in computer-readable non-transitory storage media and operable to be executed by a processor of a computing system (e.g., computing system 1000). The instructions and predefined relationships to conduct operations 800 may be stored in an MMR sensing module.

Figure 10:
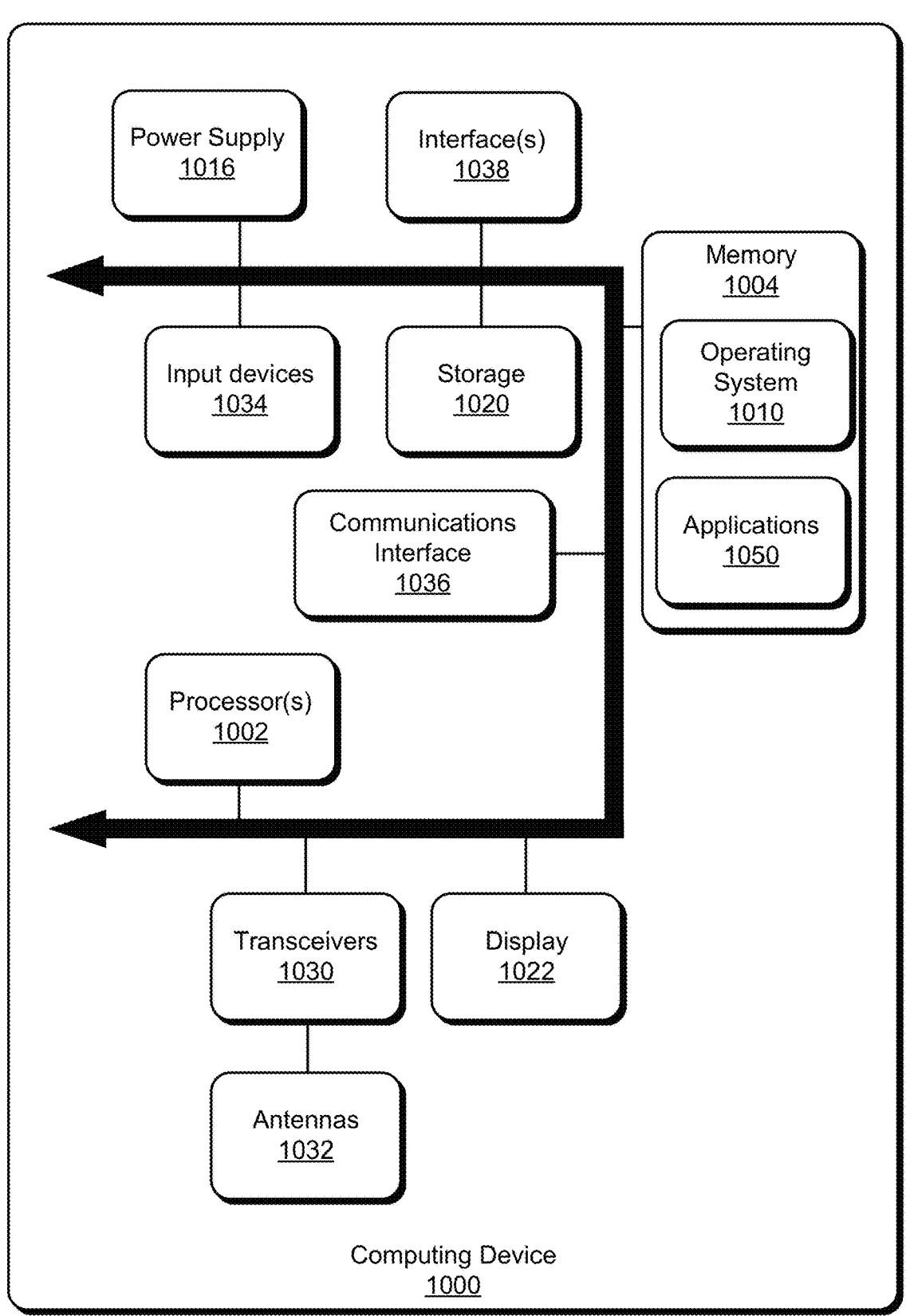
FIG. 10 illustrates an example of a computing system.

FIG. 10 illustrates an example computing system 1000 for implementing the features and operations of the described technology. The computing system 1000 may embody a remote-control device or a physical controlled device and is an example network-connected and/or network-capable device and may be a client device, such as a laptop, mobile device, desktop, tablet; a server/cloud device; an internet-of-things device; an electronic accessory; or another electronic device. The computing system 1000 includes one or more processor(s) 1002 and a memory 1004. The memory 1004 generally includes both volatile memory (e.g., RAM) and nonvolatile memory (e.g., flash memory). An operating system 1010 resides in the memory 1004 and is executed by the processor(s) 1002. The MMR devices described herein may include an implementation of computing system 1000. The memory 1004 may include one or more of an MMR memory device (e.g., to function as writable memory) and an MMR sensor device (e.g., the MMR sensor device used to sense a data state stored in memory 1004).

In an example computing system 1000, as shown in FIG. 10, one or more modules or segments, such as applications 1050, MMR device modules, MMR sensor modules, MMR memory modules, magnetic field application modules, electrical input modules, and resistance measuring modules are loaded into the operating system 1010 on the memory 1004 and/or storage 1020 and executed by processor(s) 1002. The storage 1020 may include one or more tangible storage media devices and may store predefined relationships, conditions, thresholds, magnetoresistances, electrical resistances, reset instructions, data states, data state interpretations, locally and globally unique identifiers, requests, responses, and other data and be local to the computing system 1000 or may be remote and communicatively connected to the computing system 1000.

The computing system 1000 includes a power supply 1016, which is powered by one or more batteries or other power sources, and which provides power to other components of the computing system 1000. The power supply 1016 may also be connected to an external power source that overrides or recharges the built-in batteries or other power sources.

The computing system 1000 may include one or more communication transceivers 1030, which may be connected to one or more antenna(s) 1032 to provide network connectivity (e.g., mobile phone network, Wi-Fi®, Bluetooth®) to one or more other servers and/or client devices (e.g., mobile devices, desktop computers, or laptop computers). The computing system 1000 may further include a network adapter 1036, which is a type of computing system. The computing system 1000 may use the adapter and any other types of computing systems for establishing connections over a wide-area network (WAN) or local-area network (LAN). It should be appreciated that the network connections shown are examples and that other computing systems and means for establishing a communications link between the computing system 1000 and other devices may be used.

The computing system 1000 may include one or more input devices 1034 such that a user may enter commands and information (e.g., a keyboard or mouse). These and other input devices may be coupled to the server by one or more interfaces 1038, such as a serial port interface, parallel port, or universal serial bus (USB). The computing system 1000 may further include a display 1022, such as a touch screen display.

The computing system 1000 may include a variety of tangible processor-readable storage media and intangible processor-readable communication signals. Tangible processor-readable storage can be embodied by any available media that can be accessed by the computing system 1000 and includes both volatile and nonvolatile storage media, removable and non-removable storage media. Tangible processor-readable storage media excludes communications signals (e.g., signals per se) and includes volatile and nonvolatile, removable and non-removable storage media implemented in any method or technology for storage of information such as processor-readable instructions, data structures, program modules, or other data. Tangible processor-readable storage media includes, but is not limited to, RAM, ROM, EEPROM, flash memory or other memory technology, CDROM, digital versatile disks (DVD) or other optical disk storage, magnetic cassettes, magnetic tape, magnetic disk storage, or other magnetic storage devices, or any other tangible media which can be used to store the desired information and which can be accessed by the computing system 1000. In contrast to tangible processor-readable storage media, intangible processor-readable communication signals may embody processor-readable instructions, data structures, program modules, or other data resident in a modulated data signal, such as a carrier wave or other signal transport mechanism. The term "modulated data signal" means a signal that has one or more of its characteristics set or changed in such a manner as to encode information in the signal. By way of example, and not limitation, intangible communication signals include signals traveling through wired media such as a wired network or direct-wired connection, and wireless media such as acoustic, RF, infrared, and other wireless media.

Various software components described herein are executable by one or more processors, which may include logic machines configured to execute hardware or firmware instructions. For example, the processors may be configured to execute instructions that are part of one or more applications, services, programs, routines, libraries, objects, components, data structures, or other logical constructs. Such instructions may be implemented to perform a task, implement a data type, transform the state of one or more components, achieve a technical effect, or otherwise arrive at a desired result.

Aspects of processors and storage may be integrated together into one or more hardware logic components. Such hardware-logic components may include field-programmable gate arrays (FPGAs), program- and application-specific integrated circuits (PASIC/ASICs), program- and application-specific standard products (PSSP/ASSPs), system-on-a-chip (SOC), and complex programmable logic devices (CPLDs), for example.

The terms "module," "program," and "engine" may be used to describe an aspect of a remote-control device and/or a physically controlled device implemented to perform a particular function. It will be understood that different modules, programs, and/or engines may be instantiated from the same application, service, code block, object, library, routine, API, function, etc. Likewise, the same module, program, and/or engine may be instantiated by different applications, services, code blocks, objects, routines, APIs, functions, etc. The terms "module," "program," and "engine" may encompass individual or groups of executable files, data files, libraries, drivers, scripts, database records, etc.

It will be appreciated that a "service," as used herein, is an application program executable across one or multiple user sessions. A service may be available to one or more system components, programs, and/or other services. In some implementations, a service may run on one or more server computing systems.

The logical operations making up implementations of the technology described herein may be referred to variously as operations, steps, objects, or modules. Furthermore, it should be understood that logical operations may be performed in any order, adding or omitting operations as desired, regardless of whether operations are labeled or identified as optional, unless explicitly claimed otherwise or a specific order is inherently necessitated by the claim language.

An example mechanical magnetoresistance device is provided, comprising: a first magnetoresistive well, including: at least one magnetic element; and a suspension substrate, wherein the at least one magnetic element is suspended in the suspension substrate; a first conductive element in electronic communication with a first portion of the first magnetoresistive well; and a second conductive element in electric communication with a different second portion of the first magnetoresistive well, wherein the first conductive element is in electric communication with the second conductive element via the first magnetoresistive well.

Another example mechanical magnetoresistance device of any disclosed device is provided, comprising: non-transitory computer-readable media executable by a processor operable to measure a resistance across the first magnetoresistive well between the first conductive element and the second conductive element.

Another example mechanical magnetoresistance device of any disclosed device is provided, wherein the measured resistance includes one or more of a minimum electrical resistance and a maximum electrical resistance across the first magnetoresistive well.

Another example mechanical magnetoresistance device of any disclosed device is provided, wherein the measured resistance includes a magnetoresistance, the magnetoresistance determined by determining a difference between a maximum electrical resistance measured across the first magnetoresistive well and a minimum electrical resistance measured across the first magnetoresistive well and dividing the difference by one or more of the minimum measured electrical resistance and the maximum measured electrical resistance measured across the first magnetoresistive well.

Another example mechanical magnetoresistance device of any disclosed device is provided, wherein the mechanical magnetoresistance device is a data storage memory device and the measured resistance is interpretable as a value of a readable data state.

Another example mechanical magnetoresistance device of any disclosed device is provided, wherein the data storage memory device is operable to apply a predefined magnetic field to the first magnetoresistive well, and wherein the value of the readable data state is interpreted responsive to the application of the predefined magnetic field.

Another example mechanical magnetoresistance device of any disclosed device is provided, wherein the value of the readable data state represents a predefined range of values of the measured resistance.

Another example mechanical magnetoresistance device of any disclosed device is provided, wherein the first magnetoresistive well is a high-level bit for which the readable data state is interpretable to assume one of more than two values.

Another example mechanical magnetoresistance device of any disclosed device is provided, wherein the mechanical magnetoresistance device is a sensor device, wherein the measured resistance is interpretable by the processor to determine a metric of a magnetic field applied to the sensor device that the sensor device is operable to sense.

Another example mechanical magnetoresistance device of any disclosed device is provided, wherein the metric of the applied magnetic field includes one or more of a direction and a magnitude of the applied magnetic field.

Another example mechanical magnetoresistance device of any disclosed device is provided, further comprising: a second magnetoresistive well, wherein the first magnetoresistive well is electronically coupled to the second magnetoresistive well via one of the first conductive element and the second conductive element.

Another example mechanical magnetoresistance device of any disclosed device is provided, wherein the suspension substrate of the first magnetoresistive well and a suspension substrate of the second magnetoresistive well are adapted to provide different magnetoresistive properties.

Another example mechanical magnetoresistance device of any disclosed device is provided, wherein the first magnetoresistive well is electronically coupled to the second magnetoresistive well via the one of the first conductive element and the second conductive element in a predefined orientation relative to a predefined direction of an applied magnetic field.

Another example mechanical magnetoresistance device of any disclosed device is provided, further comprising: a third magnetoresistive well; a third conductive element; and a fourth conductive element in electric communication with the third conductive element via the first magnetoresistive well, wherein the third magnetoresistive well is electronically coupled to the first magnetoresistive well via one of the third conductive element and the fourth conductive element, wherein the coupling of the first conductive element with the first magnetoresistive well and the second conductive element coupling of the first conductive element with the second conductive element substantially oppose one another relative to the first magnetoresistive well along a first axis, and wherein the coupling of the third conductive element with the first magnetoresistive well and the coupling of the fourth conductive element with the first magnetoresistive well substantially oppose one another relative to the first magnetoresistive well along a second axis.

Another example mechanical magnetoresistance device of any disclosed device is provided, wherein the mechanical magnetoresistance device is operable to introduce a first current from the first conductive element to the second conductive element and detect a first measure of resistance responsive to the introduced first current, and the mechanical magnetoresistance device is further operable to transmit a second current from the third conductive element to the fourth conductive element and measure a second measure of resistance responsive to the introduced second current.

Another example mechanical magnetoresistance device of any disclosed device is provided, wherein the first current is applied during a first time interval and the second current is applied during a second time interval, the first time interval and the second time interval being at least partially non-overlapping.

Another example mechanical magnetoresistance device of any disclosed device is provided, wherein the measure of the first current is measured during a non-overlapping portion of the first time interval and the measure of the second current is measured during a non-overlapping portion of the second time interval.

Another example mechanical magnetoresistance device of any disclosed device is provided, wherein the mechanical magnetoresistance device is operable to determine a first predefined data state of a plurality of predefined data states of the first magnetoresistive well based on the first measure of resistance and the second measure of resistance.

An example method of using a mechanical magnetoresistance device is provided, comprising: receiving a magnetic field across at least one magnetoresistive well; changing an orientation of at least one magnetic element suspended in a suspension substrate in at least one magnetoresistive well responsive to the received magnetic field, the changed orientation causing a change in a resistance across the at least one magnetoresistive well; and detecting the changed resistance.

An example method of making a mechanical magnetoresistance device is provided, comprising: forming a first magnetoresistive well; forming a first suspension substrate, including: formulating the first suspension substrate to allow rotation of a magnetic element and cause the magnetic element to remain suspended, in response to one or more predefined magnetic fields applied to the magnetic element; introducing the first suspension substrate to the first magnetoresistive well; suspending the magnetic element in the first suspension substrate; coupling a first conductive element to a first portion of the first magnetoresistive well; coupling a second conductive element to a second different portion of the first magnetoresistive well; applying a magnetic field to the first magnetoresistive well; applying an electrical input to the first conductive element, responsive to the application of the magnetic field to the first magnetoresistive well; measuring an electrical output from the second conductive element, responsive to the application of the electrical input; and determining a resistance based on the electrical input and the electrical output.

While this specification contains many specific implementation details, these should not be construed as limitations on the scope of any technologies or of what may be claimed, but rather as descriptions of features specific to particular implementations of the particular described technology. Certain features that are described in this specification in the context of separate implementations can also be implemented in combination in a single implementation. Conversely, various features that are described in the context of a single implementation can also be implemented in multiple implementations separately or in any suitable subcombination. Moreover, although features may be described above as acting in certain combinations and even initially claimed as such, one or more features from a claimed combination can in some cases be excised from the combination, and the claimed combination may be directed to a sub-combination or variation of a sub-combination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the implementations described above should not be understood as requiring such separation in all implementations, and it should be understood that the described program components and systems can generally be integrated together in a single software product or packaged into multiple software products.

A number of implementations of the described technology have been described. Nevertheless, it will be understood that various modifications can be made without departing from the spirit and scope of the recited claims.

What is claimed is:

1. A mechanical magnetoresistance device, comprising:
a first magnetoresistive well, including:
at least one magnetic element; and
a suspension substrate, wherein the at least one magnetic element is suspended in the suspension substrate;
a first conductive element in electronic communication with a first portion of the first magnetoresistive well;
a second conductive element in electric communication with a different second portion of the first magnetoresistive well, wherein the first conductive element is in electric communication with the second conductive element via the first magnetoresistive well;
a measurement unit configured to measure a resistance across the first magnetoresistive well between the first conductive element and the second conductive element, wherein the measured resistance includes a magnetoresistance, the magnetoresistance determined by determining a difference between a maximum electrical resistance measured across the first magnetoresistive well and a minimum electrical resistance measured across the first magnetoresistive well and dividing the difference by one or more of the minimum measured electrical resistance and the maximum measured electrical resistance measured across the first magnetoresistive well.

2. The mechanical magnetoresistance device of claim 1:
wherein the measurement unit comprising non-transitory computer-readable media including computer instructions executable by a processor to measure a resistance across the first magnetoresistive well between the first conductive element and the second conductive element.

3. The mechanical magnetoresistance device of claim 2, wherein the measured resistance includes one or more of a minimum electrical resistance and a maximum electrical resistance across the first magnetoresistive well.

4. The mechanical magnetoresistance device of claim 2, wherein the mechanical magnetoresistance device is a data storage memory device and the measured resistance is interpretable as a value of a readable data state.

5. The mechanical magnetoresistance device of claim 4, wherein the data storage memory device is operable to apply a predefined magnetic field to the first magnetoresistive well, and wherein the value of the readable data state is interpreted responsive to the application of the predefined magnetic field.

6. The mechanical magnetoresistance device of claim 4, wherein the value of the readable data state represents a predefined range of values of the measured resistance.

7. The mechanical magnetoresistance device of claim 6, wherein the first magnetoresistive well is a high-level bit for which the readable data state is interpretable to assume one of more than two values.

8. The mechanical magnetoresistance device of claim 2, wherein the mechanical magnetoresistance device is a sensor device, wherein the measured resistance is interpretable by the processor to determine a metric of a magnetic field applied to the sensor device that the sensor device is operable to sense.

9. The mechanical magnetoresistance device of claim 8, wherein the metric of the applied magnetic field includes one or more of a direction and a magnitude of the applied magnetic field.

10. The mechanical magnetoresistance device of claim 1, further comprising:

a second magnetoresistive well, wherein the first magnetoresistive well is electronically coupled to the second magnetoresistive well via one of the first conductive element and the second conductive element.

11. The mechanical magnetoresistance device of claim 10, wherein the suspension substrate of the first magnetoresistive well and a suspension substrate of the second magnetoresistive well are adapted to provide different magnetoresistive properties.

12. The mechanical magnetoresistance device of claim 10, wherein the first magnetoresistive well is electronically coupled to the second magnetoresistive well via the one of the first conductive element and the second conductive element in a predefined orientation relative to a predefined direction of an applied magnetic field.

13. The mechanical magnetoresistance device of claim 12, further comprising:

a third magnetoresistive well;
a third conductive element; and
a fourth conductive element in electric communication with the third conductive element via the first magnetoresistive well, wherein the third magnetoresistive well is electronically coupled to the first magnetoresistive well via one of the third conductive element and the fourth conductive element, wherein the coupling of the first conductive element with the first magnetoresistive well and the second conductive element coupling of the first conductive element with the second conductive element substantially oppose one another relative to the first magnetoresistive well along a first axis, and wherein the coupling of the third conductive element with the first magnetoresistive well and the coupling of the fourth conductive element with the first magnetoresistive well substantially oppose one another relative to the first magnetoresistive well along a second axis.

14. The mechanical magnetoresistance device of claim 13, wherein the mechanical magnetoresistance device is operable to introduce a first current from the first conductive element to the second conductive element and detect a first measure of resistance responsive to the introduced first current, and the mechanical magnetoresistance device is further operable to transmit a second current from the third conductive element to the fourth conductive element and measure a second measure of resistance responsive to the introduced second current.

15. The mechanical magnetoresistance device of claim 14, wherein the first current is applied during a first time interval and the second current is applied during a second time interval, the first time interval and the second time interval being at least partially non-overlapping.

16. The mechanical magnetoresistance device of claim 15, wherein the measure of the first current is measured during a non-overlapping portion of the first time interval and the measure of the second current is measured during a non-overlapping portion of the second time interval.

17. The mechanical magnetoresistance device of claim 14, wherein the mechanical magnetoresistance device is operable to determine a first predefined data state of a plurality of predefined data states of the first magnetoresistive well based on the first measure of resistance and the second measure of resistance.

18. A method of using a mechanical magnetoresistance device, comprising:

receiving a magnetic field across at least one magnetoresistive well;
changing an orientation of at least one magnetic element suspended in a suspension substrate in at least one magnetoresistive well responsive to the received magnetic field, the changed orientation causing a change in a resistance across the at least one magnetoresistive well;
detecting the changed resistance; and
measuring a resistance across the first magnetoresistive well between a first conductive element and a second conductive element, wherein the measured resistance includes a magnetoresistance, the magnetoresistance determined by determining a difference between a maximum electrical resistance measured across the first magnetoresistive well and a minimum electrical resistance measured across the first magnetoresistive well and dividing the difference by one or more of the minimum measured electrical resistance and the maximum measured electrical resistance measured across the first magnetoresistive well.

19. A method of making a mechanical magnetoresistance device, comprising:

forming a first magnetoresistive well;
forming a first suspension substrate, including:
formulating the first suspension substrate to allow rotation of a magnetic element and cause the magnetic element to remain suspended, in response to one or more predefined magnetic fields applied to the magnetic element;
introducing the first suspension substrate to the first magnetoresistive well;
suspending the magnetic element in the first suspension substrate;
coupling a first conductive element to a first portion of the first magnetoresistive well;
coupling a second conductive element to a second different portion of the first magnetoresistive well;
applying a magnetic field to the first magnetoresistive well;
applying an electrical input to the first conductive element, responsive to the application of the magnetic field to the first magnetoresistive well;
measuring an electrical output from the second conductive element, responsive to the application of the electrical input; and determining a resistance based on the electrical input and
the electrical output.

\* \* \* \* \*